United States Patent
Weiss et al.

(10) Patent No.: US 9,142,939 B2
(45) Date of Patent: Sep. 22, 2015

(54) METHOD AND APPARATUS FOR MOUNTING A POWER CONVERTER

(71) Applicant: Rockwell Automation Technologies, Inc., Mayfield Heights, OH (US)

(72) Inventors: Bruce W. Weiss, Milwaukee, WI (US); John R. Brubaker, Milwaukee, WI (US); Keith A. Alwardt, Hartford, WI (US); Paul J. Grosskreuz, West Bend, WI (US); Robert M. Michalski, West Bend, WI (US); Wayne O. Tobias, West Allis, WI (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 227 days.

(21) Appl. No.: 13/715,033

(22) Filed: Dec. 14, 2012

(65) Prior Publication Data

US 2013/0097851 A1     Apr. 25, 2013

Related U.S. Application Data

(62) Division of application No. 12/609,240, filed on Oct. 30, 2009, now Pat. No. 8,358,516.

(51) Int. Cl.
| | |
|---|---|
| *H05K 5/00* | (2006.01) |
| *H05K 7/00* | (2006.01) |
| *H05K 7/14* | (2006.01) |
| *H02B 1/48* | (2006.01) |
| *H02G 3/08* | (2006.01) |
| *H05K 5/02* | (2006.01) |

(52) U.S. Cl.
CPC ............. *H02B 1/48* (2013.01); *H02G 3/081* (2013.01); *H05K 5/0204* (2013.01)

(58) Field of Classification Search
CPC ..................................................... F16B 5/0208
USPC .................. 361/728, 730, 752, 796, 800, 825
See application file for complete search history.

(56) References Cited

U.S. PATENT DOCUMENTS 2,656,688 A * 10/1953 Hinkel ............................ 62/441
4,158,757 A *  6/1979 Reichert et al. ............ 200/302.1
(Continued)

FOREIGN PATENT DOCUMENTS

| GB | 2411050 A * | 8/2005 |
| JP | 2013126297 A * | 6/2013 |

(Continued)

*Primary Examiner* — Jeremy C Norris
*Assistant Examiner* — Nathan Milakovich
(74) *Attorney, Agent, or Firm* — Boyle Fredrickson, S.C.

(57) ABSTRACT

The present invention provides a power converter mounting system including a flange that cooperates with a power converter and an enclosure. The flange includes a through hole that cooperates with an opening in the enclosure to permit the power converter to extend therethrough. A number of fasteners connect to the flange and overhang a portion of the power converter. The fasteners are configured to be manipulated from a front side of the power converter. An outer perimeter of the flange extends beyond the opening in the enclosure. The flange is secured to the enclosure with a number of fasteners that are also operable from the front side of the power converter. The power converter mounting assembly is configured to secure a power converter to an enclosure so as to satisfy a variety of sealing requirements as well as allowing convenient servicing of the power converter system.

17 Claims, 7 Drawing Sheets

(56) References Cited

U.S. PATENT DOCUMENTS

| | | | |
|---|---|---|---|
| 4,500,944 A * | 2/1985 | Roberts et al. | 361/697 |
| 6,345,507 B1 * | 2/2002 | Gillen | 62/3.7 |
| 6,499,306 B2 * | 12/2002 | Gillen | 62/129 |
| 6,707,678 B2 * | 3/2004 | Kobayashi et al. | 361/752 |
| 6,753,471 B2 * | 6/2004 | Johnson et al. | 174/50 |
| 6,852,924 B2 * | 2/2005 | Lessard | 174/50 |
| 6,909,607 B2 * | 6/2005 | Radosevich et al. | 361/699 |
| 6,940,016 B1 * | 9/2005 | Cornett et al. | 174/58 |
| 6,979,777 B2 * | 12/2005 | Marcou et al. | 174/50 |
| 6,982,873 B2 * | 1/2006 | Meyer et al. | 361/699 |
| 7,334,960 B2 * | 2/2008 | Glessner et al. | 403/348 |
| 7,683,255 B2 * | 3/2010 | Hur et al. | 174/53 |
| 7,710,721 B2 * | 5/2010 | Matsuo et al. | 361/699 |
| 7,782,618 B2 * | 8/2010 | Hata et al. | 361/704 |
| 7,952,879 B1 * | 5/2011 | Vinciarelli et al. | 361/704 |
| 8,072,760 B2 * | 12/2011 | Matsuo et al. | 361/707 |
| 8,497,813 B2 * | 7/2013 | Rodger et al. | 343/872 |
| 2003/0133319 A1 * | 7/2003 | Radosevich et al. | 363/141 |
| 2003/0184981 A1 * | 10/2003 | Daniels et al. | 361/752 |
| 2005/0246982 A1 * | 11/2005 | MacMillan et al. | 52/220.8 |
| 2006/0054335 A1 * | 3/2006 | Rapp et al. | 174/48 |
| 2007/0169955 A1 * | 7/2007 | Pape et al. | 174/50 |
| 2008/0030951 A1 * | 2/2008 | Hall et al. | 361/696 |
| 2008/0047730 A1 * | 2/2008 | Johnson et al. | 174/67 |
| 2009/0139245 A1 * | 6/2009 | Blackway et al. | 62/3.62 |
| 2010/0078189 A1 * | 4/2010 | Leopold et al. | 174/50.5 |
| 2013/0219993 A1 * | 8/2013 | Del Zio et al. | 73/25.01 |

FOREIGN PATENT DOCUMENTS

| | | |
|---|---|---|
| JP | 2014023386 A * | 2/2014 |
| JP | 2014030314 A * | 2/2014 |
| WO | WO 2007018580 A2 * | 2/2007 |

* cited by examiner

METHOD AND APPARATUS FOR MOUNTING A POWER CONVERTER

CROSS-REFERENCE TO RELATED APPLICATIONS

The present Application is a divisional application of U.S. patent application, Ser. No. 12/609,240, filed on Oct. 30, 2009, which, in turn, claims the benefit of U.S. Provisional Application No. 61/112,321. The provisional application, entitled "Powered Equipment Drive Mounting Assembly," was filed on Nov. 7, 2008 and is hereby incorporated by reference in its entirety.

BACKGROUND OF THE INVENTION

The present invention is directed to power converters, for example motor drives, used to convert electrical energy from one form to another. More specifically, the present invention provides a method and apparatus for mounting the power converter.

As is known to those skilled in the art, power converters, such as motor drives, are commonly mounted within an industrial enclosure. Industrial enclosures may be configured according to many specifications such as those established by the National Electrical Manufacturers Association (NEMA), the Underwriters Laboratories (UL), or the International Electrotechnical Commission (IEC). These classifications define a series of increasing levels of protection that the enclosures must provide to personnel working around the enclosure or to the equipment contained within the enclosure. NEMA type 4 enclosures, for example, require the enclosure to be constructed for either indoor or outdoor use and to provide a degree of protection to personnel against access to hazardous parts, to provide a degree of protection of the equipment inside the enclosure against ingress of dust or water, and that will be undamaged by the external formation of ice on the enclosure. NEMA type 4X enclosures further require a level of protection against corrosion.

The environments in which the power converter and enclosure are installed typically dictate the level of protection required. The enclosures are often purchased according to the desired level of protection. The enclosures may be made of different materials, utilize different closing members, or different sealing members according to the specified level of protection. In most instances, a power converter may be mounted entirely inside the enclosure, thereby maintaining the original level of protection for which the enclosure was designed. Optionally, a power converter may need to extend outside the enclosure. For example, due to the size of the converter or due to cooling requirements, a heat sink connected to the power converter may extend through one surface of the enclosure. In order for the enclosure to retain its rated level of protection, the hole through which the power converter extends must be sealed to meet the same level of protection as required by the enclosure.

In the past, many converters configured for such an application included a flange integrally formed with the converter housing or provided an add-on flange that sealingly cooperated with the converter and the surrounding enclosure. However, providing a converter with an integral flange increases the cost associated with such converters. Further, different housings must be manufactured and supplied for each converter according to the environment in which it is to be installed.

Providing an add-on flange has also typically incurred various disadvantages. Existing add-on flanges have commonly been secured to the converter and the enclosure in such a manner that the converter can no longer be removed from the enclosure independently of the flange. Such an arrangement complicates the efforts associated with servicing the respective converters. Furthermore, removing the flange to service the converter increases the potential for leaks to form between the converter and the flange when the flange is reinstalled in the enclosure. Such flanges are susceptible to overly complicated mounting and integration assemblies, poor or inadequate sealing, assembly prior to installation of the converter, and cost increases with respect to base model assemblies.

Therefore, there is a need to provide a converter mounting assembly that can provide a generally sealed mounting of the converter in accordance with different enclosure specifications, for example, NEMA Type 4/4X, NEMA Type 12, UL Type 12, IP5X, and IP6X applications. The mounting assembly can provide multiple mounting protocols, is simple to integrate with existing product platforms, and minimally affects the cost associated with providing a converter useable in a variety of other types of applications.

BRIEF DESCRIPTION OF THE INVENTION

The present invention provides a power converter mounting system including a flange that cooperates with a power converter and an enclosure. The flange includes a through hole that cooperates with an opening in the enclosure to permit the power converter to extend therethrough. A number of fasteners connect to the flange and overhang a portion of the power converter. The fasteners are configured to be manipulated from a front side of the power converter. An outer perimeter of the flange extends beyond the opening in the enclosure. The flange is secured to the enclosure with a number of fasteners that are also operable from the front side of the power converter. The power converter mounting assembly is configured to secure a power converter to an enclosure so as to satisfy a variety of sealing requirements as well as allowing convenient servicing of the power converter system.

In one embodiment of the invention, a mounting assembly for a power converter having a housing with outer sidewalls and a lip extending outwardly from at least a portion of the outer sidewalls is disclosed. The mounting assembly includes a generally planar flange having a front surface, a rear surface, and an opening. The opening is configured to allow passage of the sidewalls of the converter therethrough. The front surface of the flange has a mating surface extending substantially around the opening to receive a rear face of the lip of the power converter, and the rear surface of the flange is configured to engage a generally planar mounting surface. The flange further includes multiple fastener openings displaced from the mating surface to clear the lip of the power converter when the lip is positioned against the mating surface. The mounting assembly further includes a sealing member fitting between the mating surface of the flange and the rear face of the lip and multiple fastening members, each fastening member engaging one of the fastening openings from the front surface of the flange and having an edge engaging a front face of the lip when the lip is positioned against the mating surface to sealingly compress the sealing member between the mating surface and the rear face of the lip.

Thus, it is a feature of this invention to provide a flange and sealing member to mount a power converter in an industrial enclosure where a portion of the converter may extend through the enclosure. The sealing member provides a degree of protection against the ingress of dust or water. Additionally, the converter may be inserted through the flange and fastened to the flange from the same side of the flange, providing easy installation and/or replacement of the power converter.

As still another aspect of the invention, the lip extends generally around an outer periphery of the power converter, and the mating surface of the flange is recessed below the front surface such that the front face of the lip is generally coplanar to the front surface of the flange when the lip is positioned against the mating surface with the sealing member positioned therebetween. The sealing member may be an o-ring.

Thus, it is another feature of this invention, that the sealing member may be positioned on the power converter prior to inserting the power converter through the opening of the flange. The drive may then be inserted through the flange and the sealing member sits between the flange and the drive, providing a seal around the entire drive.

As yet another aspect of the invention, a ridge on the flange extends away from the front surface and around at least a portion of the flange. The mounting assembly also includes a cover for the power converter having a front surface, a plurality of side surfaces, and a rim extending generally outward from a bottom edge of at least a portion of the side surfaces. A second sealing member engages the ridge and fits between the rim and the front surface of the flange. The cover has an opening in one of the side surfaces at one end of the converter, and a conduit plate is sized to fit the opening in the cover and removably connected to the front surface of the flange. A third sealing member fits between the conduit plate and the front surface of the flange. A portion of the third sealing member extends beyond each end of the conduit plate and under the cover adjacent to the conduit plate Thus, it is a feature of this invention that a cover providing additional protection may be mounted over the power converter, securing a second sealing member between the cover and the flange. The conduit plate positioned in the opening at the end of the cover permits the cover to be connected to or removed from the power converter as needed without disconnecting the electrical connections to the power converter which pass through the conduit plate. The third sealing member, in cooperation with the second sealing member, provides a seal between the cover/conduit plate and the flange which extends around the drive.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE PREFERRED EMBODIMENTS

One embodiment of the present invention is a power converter mounting system including a flange that cooperates with a power converter and an enclosure. The flange includes a through hole that cooperates with an opening in the enclosure to permit the power converter to extend therethrough. A number of fasteners connect to the flange and overhang a portion of the power converter. The fasteners are configured to be operable from the front side of the flange. An outer perimeter of the flange extends beyond the opening in the enclosure. The flange is secured to the enclosure with a number of fasteners that are also operable from the front side of the flange. The power converter mounting assembly is configured to secure a power converter to an enclosure so as to satisfy a variety of sealing requirements as well as allowing convenient servicing of the power converter system.

Figure 1:
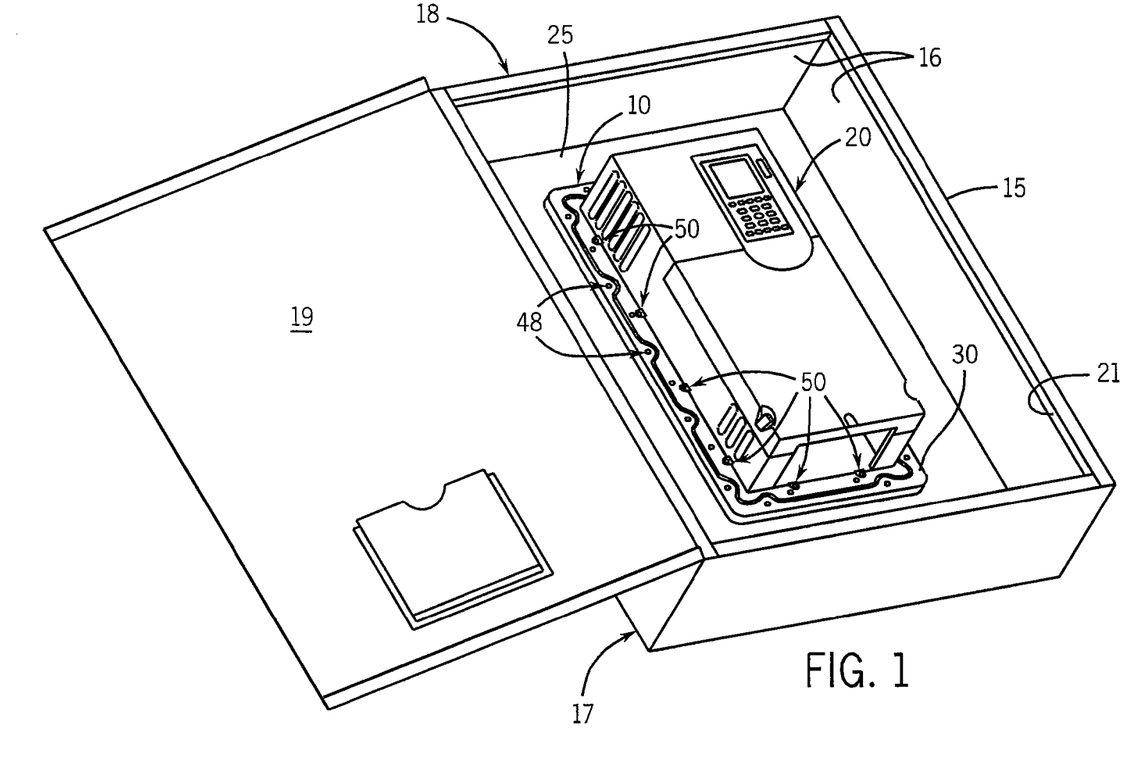
FIG. 1 is a isometric view of an exemplary power converter mounted to an industrial enclosure using a mounting assembly according to one embodiment of the present invention.
Figure 2:
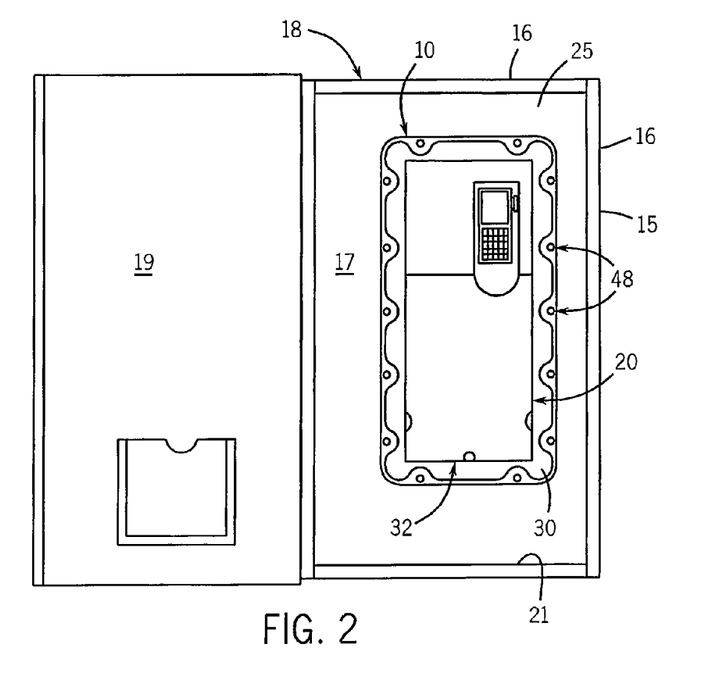
FIG. 2 is a front elevation view of the power converter and industrial enclosure of FIG. 1.
Figure 3:
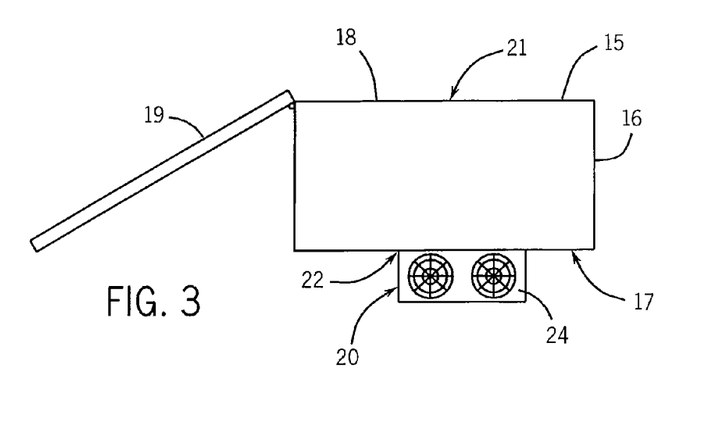
FIG. 3 is a top plan view of the power converter and industrial enclosure of FIG. 1.
Figure 4:
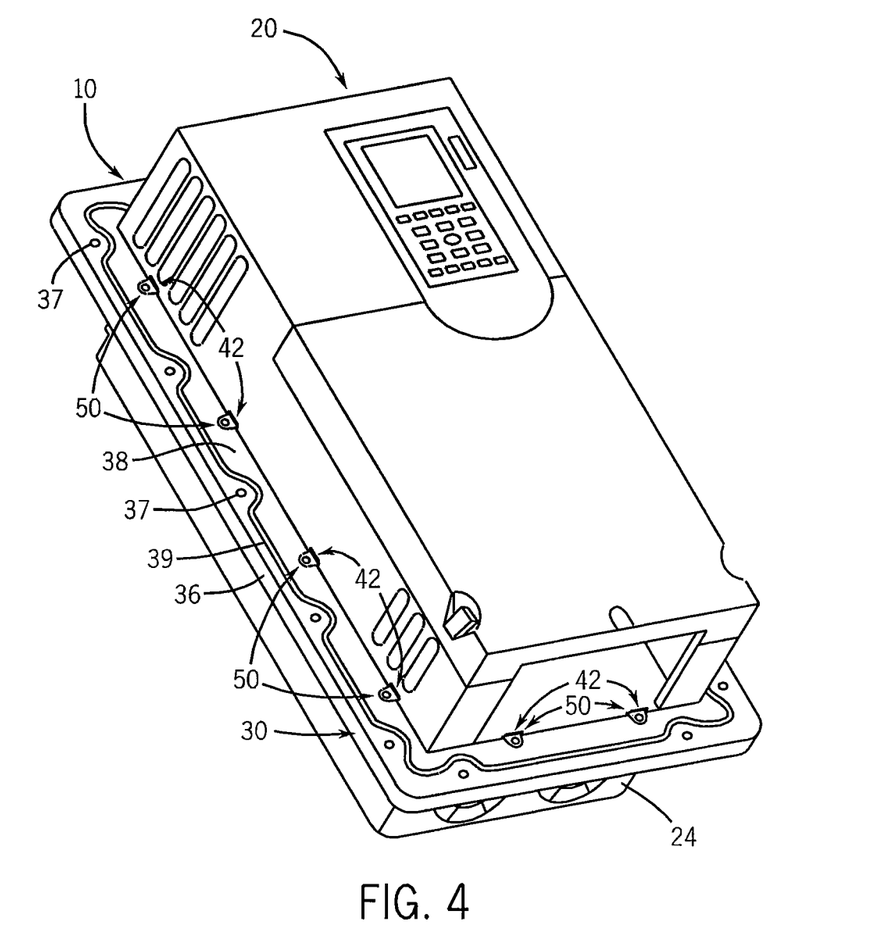
FIG. 4 is an isometric view of an exemplary power converter and a flange according to the present invention.

Turning initially to FIGS. 1-3, an exemplary power converter 20 is mounted to an industrial enclosure 15 using a mounting assembly 10 according to one embodiment of the present invention to provide a seal between the power converter 20 and the enclosure 15. The enclosure 15 has a plurality of sides 16, a back surface 17, and a front surface 18. An access panel 19 is typically connected to the front surface 18 to alternately cover an opening 21 in the front surface 18 and provide access to the interior of the enclosure 15. The access panel 19 may be of any type known in the art such as a hinged or sliding door or a panel that is removably fastened to the front surface 18, for example by screws or clips. Optionally, a sealing member, such as a gasket, for the enclosure 15 may be provided around the perimeter of the opening 21 to meet the requirements for protecting the interior of the cavity according to the enclosure specifications, such as NEMA, UL, or IEC requirements.

As further seen in FIGS. 1-3, a power converter 20 may be mounted in the enclosure 15 such that a portion of the converter 20 extends through an opening 22, which is typically cut in the back surface 17, according to the mounting location of the converter 20. A flange 30 is first positioned such that an opening 32 in the flange aligns with the opening 22 in the back surface 17. The flange 30 is secured to the back surface 17 by appropriate first fastening members 48, for example, screws or bolts. The first fastening members 48 are preferably operable such that the flange 30 may be secured to or released from the back surface 17 from the front surface 38 of the flange 30, that is from within the enclosure 15 as illustrated in FIGS. 1-3. A portion of the converter 20, for example the heat sink and fan assemblies, may then be passed through the openings 32 and 22 in the flange 30 and in the back surface 17, respectively. Second fastening members 50 secure the converter 20 to the flange 30. Preferably, the second fastening members 50 are clips that may also be secured to the flange 30 from within the enclosure 15. Thus, both the first 48 and the second 50 fastening members may be manipulated from the same side of the flange 30 and, preferably, from a front surface 38 of the flange 30 facing into the enclosure 15.

Referring next to FIGS. 4-8, the sealing engagement between the flange 30 and the converter 20 is illustrated. The flange 30 is generally planar and includes a front surface 38, a rear surface, and an interior opening 32 that is similar in size to a base 24 of the converter 20. The front surface 38 of the flange 30 has a mating surface 34 extending around the periphery of the interior opening 32 to receive a rear surface of the lip 28 of the converter 20. First fastener openings, displaced from the mating surface 34 far enough to clear the lip 28 of the converter 20 when the converter 20 is positioned against the flange 30, extend around the front surface 38 of the flange 30. Second fastener openings 37, displaced from the outer edge 36 of the flange 30, extend through and are spaced around each side of the flange 30 for securing the flange 30 to a mounting surface 25. A portion of each opening 37 may be threaded to receive a first fastening member 48, such as a screw or a bolt. Optionally, the inner surface of the opening 37 may be smooth permitting a fastening member 48 to pass through the opening 37 and engage a threaded opening in the mounting surface 25. The flange 30 may be formed of any suitable material known to one skilled in the art and is preferably formed of a material that is sufficiently pliable to support a sealed interaction between adjacent structures and rigid enough to cooperate with and support such structures. For example, the flange 30 could be formed from a composite material, such as plastic, or rubber over a metal or an otherwise more rigid and robust material.

Figures 6, 7, 8:
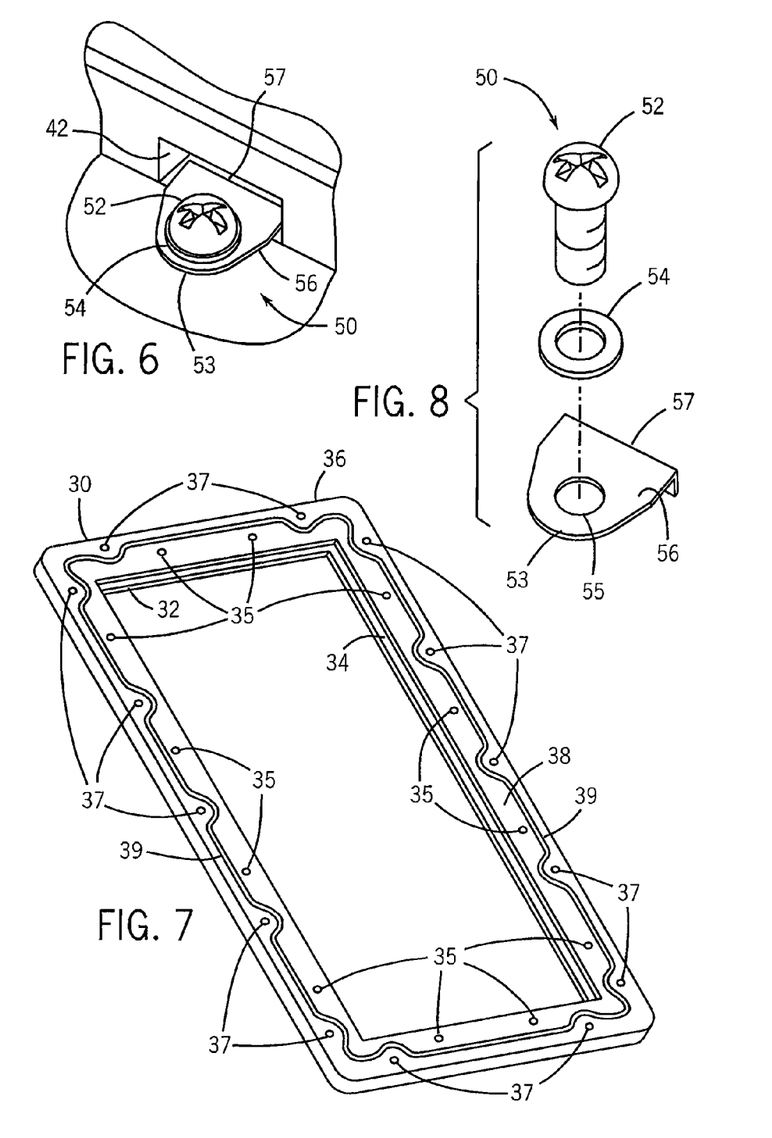
FIG. 6 is a partial isometric view of FIG. 4 illustrating an exemplary fastener securing the power converter to the flange.
FIG. 7 is an isometric view of the flange of FIG. 4.
FIG. 8 is an isometric view of the fastener of FIG. 6.

The converter 20 is secured to the flange 30 by fastening members 50. The fastening members 50 preferably include a screw 52, a washer 54, and a clip 56. Each clip 56 includes a first portion 53 and a second portion 57. The first portion 53 generally overlies the flange 30 and includes a hole 55 extending generally through the center of the first portion 53. The second portion 57 extends away from the hole 55 and is configured to engage the converter 20 by extending into a cavity 42 along the outer surface of the converter 20. As shown in FIGS. 6 and 8, the screw 52 passes through the washer 54 and the hole 55 into a threaded portion 35 of the flange 30. The screw 52 may be secured to the threaded portion 35 of the flange 30 from the outer surface of the flange 30. Optionally, any suitable fastening means for securing the converter 20 to the flange 30, which is operable from the outer surface 38 of the flange 30, may be used.

Figure 5:
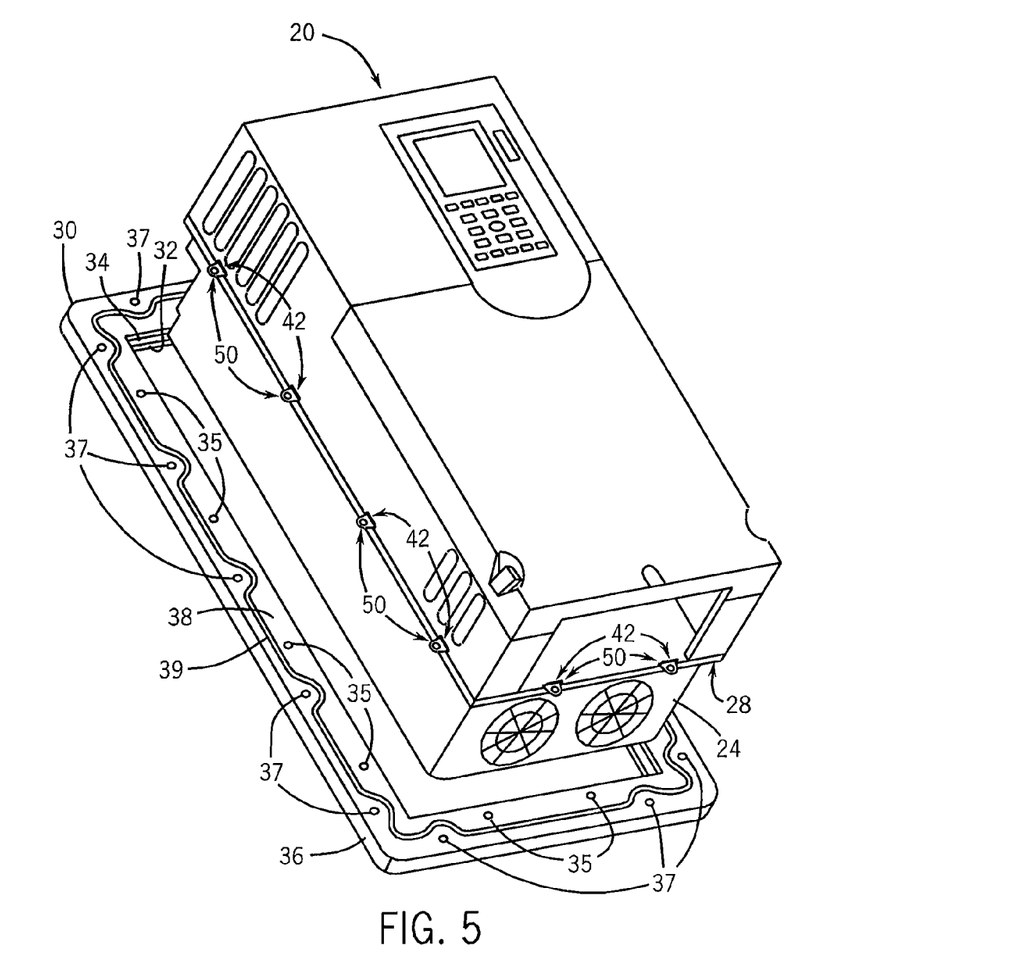
FIG. 5 is an exploded view of the power converter and flange of FIG. 4.

Referring to FIG. 5, a lip 28 extends around the periphery of the converter 20. The rear face of the lip 28 is configured to engage the mating surface 34 of the flange 30. The mating surface 34 is preferably recessed below the outer surface 38 of the flange 30, forming a lip around the opening 32 in the flange 30 such that the front face of the lip 28 is generally even with the outer surface 38 of the flange when the converter 20 is secured to the flange 30. Preferably, a sealing member 40, such as an 0-ring, is disposed between the flange 30 and the lip 28 of the converter 20.

Figure 9:
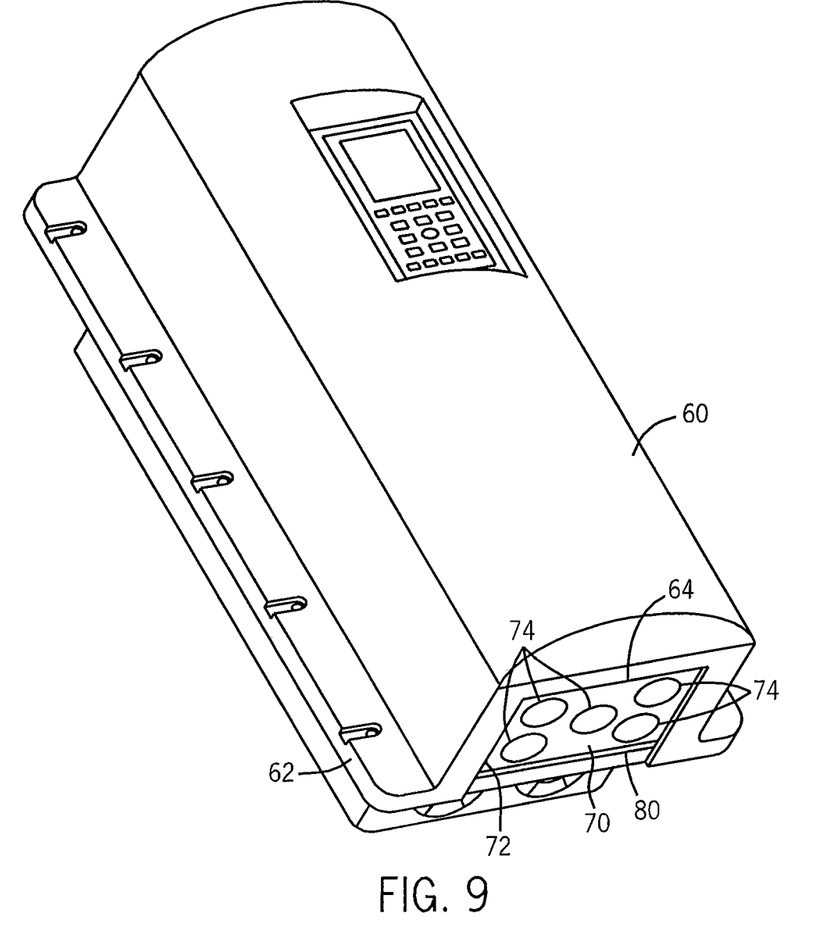
FIG. 9 is an isometric view of an exemplary power converter with a type 12 cover connected to the flange.
Figure 10:
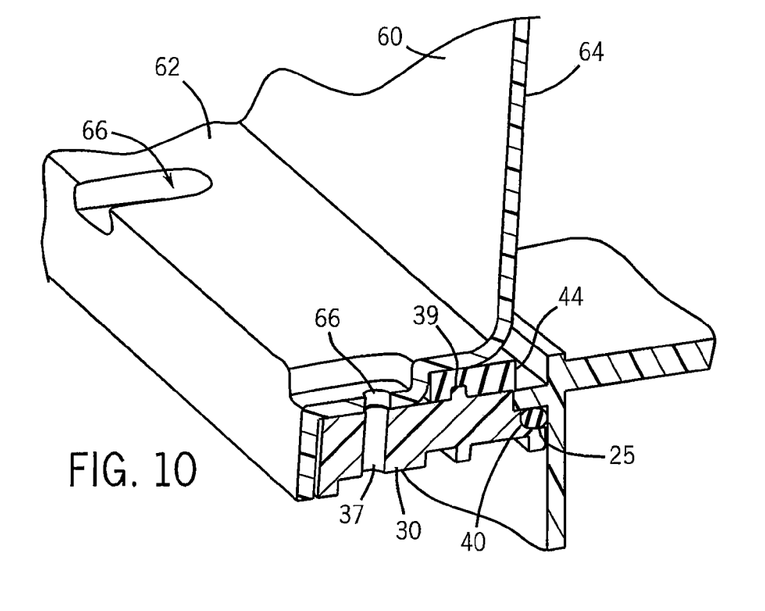
FIG. 10 is a partial cross-sectional view taken at the point shown in FIGS. 9.
Figure 11:
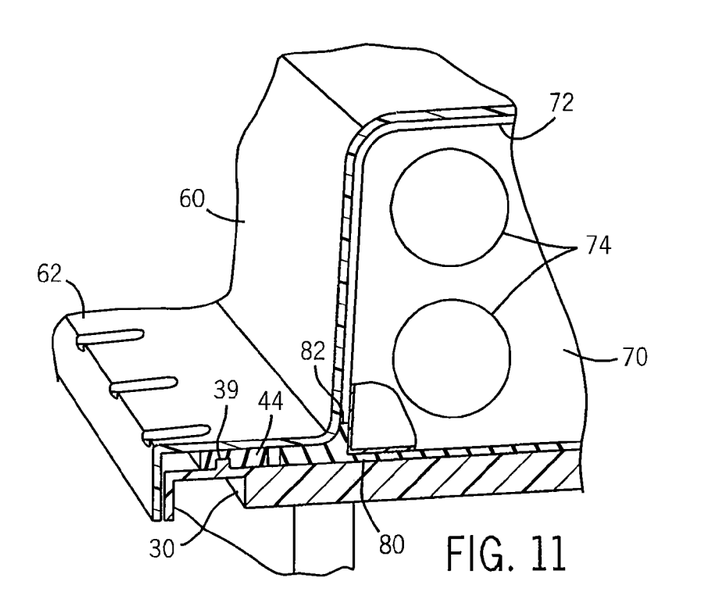
FIG. 11 is a partial cross-sectional view taken at the point shown in FIG. 9.

In another embodiment, a cover 60 may be required as a further seal over the converter 20, as seen in FIGS. 9-11. The cover 60 includes a rim 62 which extends around a portion of the cover 60, and preferably generally around three sides of the cover 60. The rim 62 extends beyond the outer edge 36 of the flange 30. A second sealing member 44 is preferably positioned between the rim 62 of the cover 60 and the front surface 38 of the flange 30. The flange 30 includes a ridge 39 which extends outward from the front surface 38 to engage the second sealing member 44. The ridge 39 preferably extends generally around three sides of the flange 30 to align with the rim 62 of the cover. A series of holes 66 extend through the rim 62 of the cover 60 and align with a series of openings 37 in the flange 30. A fastener, not shown, such as a screw is passed through each of the holes 66 in the cover 60 and into the corresponding openings 37 in the flange 30. Preferably, the openings 37 in the flange include a threaded portion into which a screw may engage to secure the cover 60 to the flange. Optionally, the threaded portion may extend over a portion of or for the entire depth of the opening 37. The opening 37 may extend partially or entirely through the flange 30. Optionally, any other suitable means of securing the cover 60 to the flange 30 may be used such that the rim of the cover 60 engages a first side of the sealing member 44 and that an opposite side of the sealing member 44 engages the flange 30 and, preferably, the ridge 39 on the flange 30.

The cover 60 further includes an opening 64 at one end. A conduit plate 70 is included having an outer periphery 72 which fits the opening 64 in the cover 60. A third sealing member 80 may be provided that is generally positioned between the conduit plate 70 and the flange 30. The third sealing member 80 preferably extends along the flange 30 beyond each side of the conduit plate 70 such that the each end of the third sealing member 80 is positioned between the rim 62 of the cover 60 and the flange 30. The third sealing member 80 may further include a raised portion 82 formed to extend away from the flange 30 and between at least a portion of the cover 60 and the conduit plate 70. The second 44 and third 80 sealing members cooperate to provide a seal extending substantially around the entire length of the outer surface 38 of the flange 30. The conduit plate 70 includes at least one opening 74 for electrical wiring for power and control connections to the converter 20. Optionally, each opening 74 includes a "knockout" such that unused openings 74 remain covered. The knockout being a portion of the conduit plate 70 that is at least partially cut, punched, or otherwise configured such that the material covers but may readily be removed from the interior of the opening 74.

In operation, the mounting assembly 10 may be used to connect the converter 20 to the mounting surface 25, for example an industrial enclosure 15, while retaining a first desired level of protection, for example a NEMA 4/4X rating. Preferably, the flange 30 is first connected to the mounting surface 25, but optionally, the flange 30 may be connected to the converter 20 first. At least one first fastener, such as a screw, may be used to connect the flange 30 to the mounting surface 25 from within the enclosure 15. A sealing member 40, such as an o-ring, may be positioned around the base 24 of the converter 20. Optionally, the o-ring may be positioned around the mating surface 34 of the flange 30. The base 24 of the converter 20 is inserted through the opening 32 in the flange 30 and, if the flange 30 is connected to the enclosure 15, through the opening 22 in the enclosure 15. At least one second fastening member 50 connects the converter 20 to the flange 30. The sealing member 40 is thereby secured between the mating surface 34 and a lip 28 of the converter 20 providing a sealed interface between the converter 20 and the enclosure 15 that meets the requirements for the first desired level of protection.

Optionally, the mounting assembly 10 may be used to connect the converter 20 to the mounting surface 25, for example an industrial enclosure 15, while retaining a second desired level of protection, for example a NEMA 12 rating. Preferably, the converter 20 is connected to the flange 30 in the same manner as described above for the first desired level of protection. A second 44 and a third 80 sealing member may additionally be positioned generally around the front surface 38 of the flange 30. The conduit plate 70 may then be positioned above the third sealing member 80. A cover 60 is placed over the converter 20 such that the rim 62 of the cover 60 is positioned above the second sealing member 44 and that the conduit plate 70 fits within the opening 64 of the cover 60. The cover 60 is secured to the flange 30 by a fastening means such as a threaded fastener engaging a threaded portion of each hole 66 in the cover 60 or each of the corresponding openings 37 in the flange 30.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention

We claim:

1. A method of mounting a power converter to a mounting surface, wherein the mounting surface has a front side, a rear side, and an opening extending between the front side and the rear side, the opening configured to allow at least a portion of the power converter to extend therethrough, the method comprising the steps of:
    attaching a flange to the mounting surface with one or more fasteners operable from the front side of the mounting surface, the flange having a front surface, a rear surface, and an opening configured to allow at least the portion of the power converter to extend therethrough; and
    securing the power converter to the flange with one or more fastening members operable from the front side of the mounting surface.

2. The method of claim 1 wherein the step of securing the power converter further comprises the steps of:
    attaching the fastening members to the front surface of the flange;
    positioning a sealing member along a mating surface of the flange;
    inserting the portion of the power converter through the openings of the flange and of the mounting surface thereby positioning the sealing member between the mating surface of the flange and a lip of the power converter; and
    attaching the fastening members to the power converter.

3. The method of claim 2 further comprising the steps of:
    positioning a second sealing member around at least a portion of the front surface of the flange;
    positioning a third sealing member on the front surface of the flange and generally along one end of the flange wherein the combination of the second and third sealing members extend substantially around the front surface of the flange;
    attaching a cover for the power converter to the front surface of the flange wherein the second sealing member and at least a portion of the third sealing member are positioned between a rim of the cover and the flange; and
    attaching a conduit plate to the front surface of the flange along the end of the flange having the third sealing member wherein the third sealing member is positioned between the conduit plate and the flange.

4. The method of claim 3 wherein the cover, the conduit plate, the second sealing member, and the third sealing member work together to satisfy one of UL type 12, IP5X, and NEMA type 12 sealing requirements for the converter.

5. The method of claim 1 wherein:
    the power converter is mounted in an enclosure,
    the enclosure includes a rear surface, a plurality of side surfaces, a front surface, an access opening extending through at least a portion of the front surface, and an access panel removably covering the access opening, and
    the mounting surface is the rear surface of the enclosure.

6. A method of securing a power converter to a flange with a plurality of fastening members, wherein the flange includes a front surface, a rear surface opposite the front surface, an opening which defines an inner periphery of the flange and which extends between the front surface and the rear surface, a mating surface recessed below the front surface and extending around the inner periphery of the flange, and a plurality of fastener openings proximate to the mating surface, each fastener opening in the front surface of the flange and extending through at least a portion of a thickness of the flange, the method comprising the steps of:
    positioning a sealing member generally along the mating surface of the flange;
    inserting the power converter through the opening in the flange until a portion of the power converter engages the sealing member;
    orienting a second portion of each of the fastening members to engage the power converter; and
    securing a first portion of each of the fastening members to one of the fastener openings, thereby compressing the sealing member between the mating surface of the flange and the power converter.

7. The method of claim 6 wherein each fastening member includes a threaded member and a clip, and wherein the clip includes a first end having an opening configured to receive the threaded member and a second end configured to engage the power converter.

8. The method of claim 6 including the initial steps of:
    aligning the opening in the flange to an opening in a mounting surface; and
    securing the flange to the mounting surface from the front of the flange.

9. The method of claim 8 wherein the flange is secured to the mounting surface with a plurality of fasteners, each of the fasteners engaging one of a second set of fastener openings extending through the flange.

10. The method of claim 8 wherein the power converter is mounted in an enclosure having a rear surface, a plurality of side surfaces, a front surface, an access opening extending through at least a portion of the front surface, and an access panel removably covering the access opening and wherein the mounting surface is the rear surface of the enclosure.

11. The method of claim 6 further comprising the steps of:
positioning a second sealing member around at least a portion of the front surface of the flange;
positioning a third sealing member on the front surface of the flange and generally along one end of the flange wherein the combination of the second and third sealing members extend substantially around the front surface of the flange;
attaching a cover for the power converter to the front surface of the flange wherein the second sealing member and at least a portion of the third sealing member are positioned between a rim of the cover and the flange; and
attaching a conduit plate to the front surface of the flange along the end of the flange having the third sealing member wherein the third sealing member is positioned between the conduit plate and the flange.

12. The method of claim 11 wherein the cover, the conduit plate, the second sealing member, and the third sealing member work together to satisfy one of UL type 12, IP5X, and NEMA type 12 sealing requirements for the converter.

13. A method of mounting a power converter to a mounting surface, wherein the mounting surface has a front side, a rear side, and an opening extending between the front side and the rear side, the opening configured to allow at least a portion of the power converter to extend therethrough, the method comprising the steps of:
connecting a flange to the mounting surface from the front side of the mounting surface, wherein the flange includes a mating surface extending around an opening in the flange and wherein the opening in the flange is generally aligned with the opening in the mounting surface;
positioning a sealing member along the mating surface of the flange;
inserting the power converter through the opening in both the flange and the mounting surface such that a portion of the power converter engages the sealing member; and
securing the power converter to the flange with a plurality of fastening members from the front side of the flange.

14. The method of claim 13 wherein the flange further includes a front surface, a rear surface, a thickness, and a plurality of fastener openings in the front surface extending through at least a portion of the thickness of the flange, and wherein each of the plurality of fastening members engages one of the fastener openings to secure the power converter to the flange.

15. The method of claim 14 further comprising the steps of:
positioning a second sealing member around at least a portion of the front surface of the flange;
positioning a third sealing member on the front surface of the flange and generally along one end of the flange wherein the combination of the second and third sealing members extend substantially around the front surface of the flange;
attaching a cover for the power converter to the front surface of the flange wherein the second sealing member and at least a portion of the third sealing member are positioned between a rim of the cover and the flange; and
attaching a conduit plate to the front surface of the flange along the end of the flange having the third sealing member wherein the third sealing member is positioned between the conduit plate and the flange.

16. The method of claim 15 wherein the cover, the conduit plate, the second sealing member, and the third sealing member work together to satisfy one of UL type 12, IP5X, and NEMA type 12 sealing requirements for the converter.

17. The method of claim 13 wherein:
the power converter is mounted in an enclosure,
the enclosure includes a rear surface, a plurality of side surfaces, a front surface, an access opening extending through at least a portion of the front surface, and an access panel removably covering the access opening, and
the mounting surface is the rear surface of the enclosure.

* * * * *